(12) United States Patent
Yeager et al.

(10) Patent No.: US 6,617,398 B2
(45) Date of Patent: *Sep. 9, 2003

(54) POLY (PHENYLENE ETHER)—POLYVINYL THERMOSETTING RESIN

(75) Inventors: Gary W. Yeager, Schenectady, NY (US); Robert E. Colborn, Schenectady, NY (US)

(73) Assignee: General Electric Company, Pittsfield, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/943,342

(22) Filed: Aug. 30, 2001

(65) Prior Publication Data

US 2002/0028337 A1 Mar. 7, 2002

Related U.S. Application Data

(63) Continuation of application No. 09/452,733, filed on Dec. 1, 1999, now Pat. No. 6,352,782.

(51) Int. Cl.$^7$ .................. C08L 71/12; C09D 171/12
(52) U.S. Cl. .................. 525/391; 528/205; 428/457; 428/458; 428/461; 428/462; 428/463
(58) Field of Search .................. 525/391; 528/205; 428/458, 461, 457, 462, 463

(56) References Cited

U.S. PATENT DOCUMENTS

| | | |
|---|---|---|
| 3,306,875 A | 2/1967 | Hay |
| 3,356,761 A | 12/1967 | Fox |
| 3,375,228 A | 3/1968 | Holoch et al. |
| 3,557,045 A | 1/1971 | Wright et al. |
| 3,597,216 A | 8/1971 | Berardinelli et al. |
| 3,637,578 A | 1/1972 | Wright et al. |
| 3,883,612 A | 5/1975 | Pratt et al. |
| 3,936,414 A | 2/1976 | Wright et al. |
| 4,048,143 A | 9/1977 | Hay et al. |
| 4,148,843 A | 4/1979 | Goossens |
| 4,165,422 A | 8/1979 | White et al. |
| 4,663,230 A | 5/1981 | Tennent |
| 4,327,013 A | 4/1982 | Peters |
| 4,521,491 A | 6/1985 | Oizumi et al. |
| 4,562,243 A | 12/1985 | Percec |
| 4,565,684 A | 1/1986 | Tibbetts et al. |
| 4,572,813 A | 2/1986 | Arakawa |
| 4,604,417 A | 8/1986 | Cottman |
| 4,618,703 A | 10/1986 | Thanawalla et al. |
| 4,634,742 A | 1/1987 | Percec |
| 4,663,402 A | 5/1987 | Percec et al. |
| 4,665,137 A | 5/1987 | Percec |
| 4,667,185 A | 6/1987 | Heitz et al. |
| 4,677,185 A | 6/1987 | Heitz et al. |
| 4,701,514 A | 10/1987 | Percec |
| 4,760,118 A | 7/1988 | White et al. |
| H521 H | 9/1988 | Fan |
| 4,806,601 A | 2/1989 | Percec |
| 4,816,289 A | 3/1989 | Komatsu et al. |
| 4,816,515 A | 3/1989 | Weiss |
| 4,871,816 A | 10/1989 | Percec et al. |
| 4,874,826 A | 10/1989 | Sakamoto et al. |
| 4,876,078 A | 10/1989 | Arakawa et al. |
| 4,888,397 A | 12/1989 | van der Meer et al. |
| 4,923,932 A | 5/1990 | Katayose et al. |
| 5,024,818 A | 6/1991 | Tibbetts et al. |
| 5,039,781 A | 8/1991 | Neugebauer et al. |
| 5,061,602 A | 10/1991 | Koch et al. |
| 5,071,922 A | 12/1991 | Nelissen et al. |
| 5,079,268 A | 1/1992 | Nelissen et al. |
| 5,091,480 A | 2/1992 | Percec |
| 5,165,909 A | 11/1992 | Tennent et al. |
| 5,171,761 A | 12/1992 | Penco et al. |
| 5,213,886 A | 5/1993 | Chao et al. |
| 5,218,030 A | 6/1993 | Katayose et al. |
| 5,219,951 A | 6/1993 | Nelissen et al. |
| 5,304,600 A | 4/1994 | Nelissen et al. |

(List continued on next page.)

FOREIGN PATENT DOCUMENTS

| | | |
|---|---|---|
| DE | 31 17 514 A1 | 2/1981 |
| DE | 41 03 140 A1 | 2/1991 |
| EP | 0 261 574 B1 | 9/1987 |
| EP | 0 385 065 A1 | 1/1990 |
| EP | 498 088 A1 | 12/1991 |
| NL | 8902092 | 8/1989 |

OTHER PUBLICATIONS

Derwent Abstract for JP08–245872.

Coleen Pugh and V. Percec, "Group Transfer Polymerization of Some Unusual Acrylates and Methacrylates", Polym. Prepr. (Am. Chem. Soc., Div. Polym. Chem.), (1985), 26(2), 303–5.

U.S. patent application Ser. No. 09/681,376, Zarnoch et al., filed Mar. 27, 2001.

U.S. patent application Ser. No. 09/681,381, Teutsch et al., filed Mar. 27, 2001.

U.S. patent application Ser. No. 09/683,214, Yeager et al., filed Dec. 3, 2001.

U.S. patent application Ser. No. 09/683,352, Braat et al., filed Dec. 18, 2001.

U.S. patent application Ser. No. 09/765,065, Zarnoch et al., filed Jan. 17, 2001.

U.S. patent application Ser. No. 10/063,152, Braat et al., filed Mar. 26, 2002.

U.S. patent application Ser. No. 10/119,406, Merfeld et al., filed Apr. 9, 2002.

*Primary Examiner*—Patricia A. Short

(57) ABSTRACT

A capped poly(phenylene ether) resin composition is formed from (1) a poly(phenylene ether) compound (PPE) in which at least a portion, preferably substantially all of the hydroxyl groups have been reacted with a compound containing ethylenic unsaturation (carbon-carbon double bonds) which is further reactive with unsaturated monomers (reactively endcapped PPE) and (2) a curable unsaturated monomer composition. The composition optionally contains a polymerization catalyst; a flame-retardant compound; and fibrous reinforcement. The composition can be cured to form a laminate, and clad with copper to form a circuit board.

56 Claims, No Drawings

U.S. PATENT DOCUMENTS

| | | |
|---|---|---|
| 5,310,820 A | 5/1994 | Nelissen et al. |
| 5,338,796 A | 8/1994 | Vianello et al. |
| 5,352,745 A | 10/1994 | Katayose et al. |
| 5,407,972 A | 4/1995 | Smith et al. |
| 5,591,382 A | 1/1997 | Nahass et al. |
| 5,834,565 A | 11/1998 | Tracy et al. |
| 5,851,646 A | 12/1998 | Takahashi et al. |
| 5,965,663 A | 10/1999 | Hayase |
| 6,022,550 A | 2/2000 | Watanabe |
| 6,306,963 B1 | 10/2001 | Lane et al. |
| 6,352,782 B2 | 3/2002 | Yeager et al. |
| 6,384,176 B1 | 5/2002 | Braat et al. |
| 2002/0077447 A1 | 6/2002 | Hwang et al. |

POLY (PHENYLENE ETHER)— POLYVINYL THERMOSETTING RESIN

CROSS-REFERENCE TO RELATED APPLICATIONS

This application is a continuation of U.S. Ser. No. 09/452,733 filed Dec. 1, 1999, now U.S. Pat. No. 6,352,782.

STATEMENT REGARDING FEDERALLY SPONSORED RESEARCH

Not applicable

BACKGROUND OF THE INVENTION

The present invention is related to polymerizable compositions with excellent thermal and dielectric properties suited for applications such as molding, laminating, encapsulation, coating or potting. A desired application of the present invention is in molding compositions where excellent dielectric and thermal properties, solvent resistance and low coefficients of thermal expansion are required. Another desired application is in laminating products that are useful for composites and dielectrics as for example in printed circuit boards. Further, the present invention relates to a process for making thermoset polymer resins and laminates, and to products characterized by excellent dielectric and thermal properties that can be made to exhibit excellent solvent resistance and flame resistance. More particularly, the present invention relates to reactively end capped poly(phenylene ether) compounds and to their cure with certain unsaturated compounds for synthesizing resins ideally adapted for impregnating fibrous reinforcement in the manufacture of circuit boards.

Thermoset molding compositions known in the art, are generally thermosetting resins containing inorganic fillers and/or fibers. Upon heating these materials initially exhibit viscosities low enough to allow for melt processing and molding of an article from the filled thermoset monomer composition. Upon further heating the thermosetting monomers react and cure to form hard resins with high modulus.

Metal-clad boards, particularly such boards for use in fabricating printed circuits, are also well-known in the art. The simplest of such boards generally comprises a resinous plastic (polymeric) substrate to which is bonded at least one thin sheet (foil) of an electrically conductive material, preferably copper. The resinous plastic substrate can be clad with the metal foil on one or both sides, depending upon the desired use, and can be rigid or flexible depending upon the composition of the resinous plastic substrate, the choice of reinforcement (if any), and the intended use of the board.

A number of polyphenylene ether compositions having favorable dielectric properties and utility in circuit board manufacture are known. However, due to deficiencies in one or more properties, many such compositions have not attained wide commercial use. Specifically, while polyphenylene ethers exhibit excellent dielectric properties, deficiencies often are found in areas such as, inter alia, solvent resistance, flammability, solderability, and resistance to high temperatures. Moreover, times required for curing such compositions typically are too long for effective manufacture of circuit boards in large volume.

In addition to excellent dielectric properties, resinous compositions to be used for printed circuit board manufacture should be highly flame-retardant. A V-1 rating, as determined by Underwriters Laboratories test procedure UL-94, is universally required, with V-0 usually being preferred. The V-0 rating requires a flame-out time (FOT) of not more than 10 seconds in any trial and a cumulative FOT of not more than 50 seconds for five samples. As a practical matter, purchasers often mandate a maximum cumulative FOT of 35 seconds.

The fabricated board should not lose substantial weight and its surface should not be appreciably marred by contact with methylene chloride, a solvent commonly used for cleaning. Since conductive connections with the printed circuit typically are made by soldering, the board must be solder-resistant as evidenced by the lowest possible percent increase in thickness (Z-axis expansion) when exposed to liquid solder at 288° C. In addition to all these properties of the cured material, a relatively short curing time is highly desirable.

In preparing rigid metal-clad boards, it is common to form individual lamina, commonly called prepregs, by formulating a resinous binder composition made from epoxy, modified styrene, or the like. A liquid resin or solvent solution of the resin is placed impregnated into continuous webs of reinforcement and then dried and or partially cured in a vertical or horizontal treating tower or oven. Normally, the resin is partially cured or B-staged after exiting the treater tower or oven. The copper foil, optionally coated with an adhesive, is placed on one side of the prepreg and subjected to heating under pressure to effect a bond between the metal foil and the substrate. Multiple prepregs can be used in forming a single composite board. Additionally, multilayer printed wiring boards will have a number of interposed laminae and copper sheets.

Pressing of the boards can be effected in a press by placing the foil/substrate structure between the platens and closing the press, or a continuous belt can be used. The curing cycle in the press will depend upon the nature and thickness of the laminate, the time and temperature of the cycle being those required to cure the substrate, and the bonding adhesive layer, if present. Sufficient pressure is required to effect adequate flow of the adhesive and/or substrate resins in order to wet-out and bond adequately. The pressure must be sufficient to prevent blistering which is due to the release of gases resulting either from retained volatiles in the substrate or adhesive layers, or resulting from by-products of the curing process.

Heretofore, Fox (U.S. Pat. No. 3,356,671) describes blends of high molecular weight, uncapped PPE (molecular weight 10,000 and preferably 50,000) with a liquid unsaturated vinyl monomer selected from the group consisting of styrenics, divinylbenzene, vinylpyridines, and alkylated and halogenated derivatives useful for film and fiber applications. Fox does not teach the advantages of capped PPE and said blends of capped PPE with allylic monomers, blend thereof, or blends of allylic monomers with styrenic monomers. Further he does not teach the advantages of alkylated styrenes, such a t-butyl styrene, in enhancing the thermal performance of the blend. He also does not demonstrate the significant thermal advantages of using a butylated styrene.

Wright, et al. (U.S. Pat. No. 3,557,045) disclose a thermosetting resin composition comprising (i) a polymerizable material containing a carbon-carbon double bonds, at least 5% of which is a liquid monomer, (ii) a poly(phenylene ether) resin, and (iii) a radical initiator. In particular the Wright, et al. teach compositions comprising a diallyl phthalate prepolymer, a poly(phenylene ether) resin, and a radical initiator, in which the composition is described as having improved electrical and mechanical properties.

Wright, et al. (U.S. Pat. No. 3,637,578) disclose a thermosetting resin composition comprising (i) a mixture of a liquid monomer containing carbon-carbon double bonds in an amount of at least 5% and having boiling point of 70° C. or higher with a reactive polyester resin, (ii) a poly (phenylene ether) resin, and (iii) a radical initiator. It is described that the thermosetting resin composition can be cured to obtain a thermoset resin having improved electrical and mechanical properties. Examples 3–2 and 3–4 of this Wright, et al. patent disclose compositions comprising a poly(phenylene ether) resin, a polyester resin, triallyl cyanurate, and diallyl phthalate. The poly(phenylene ether) content of the composition is 20% and the balance is comprised of crosslinking components (i.e. polyester resin, triallylcyanurate, and diallyl phthalate).

Wright, et al. (U.S. Pat. No. 3,936,414) describe flame retardant compositions comprising (i) 10–50 parts by weight of a polyunsaturated monomer, (ii) 5–30 parts by weight of a polychlorinated or polybrominated aromatic hydrocarbon having a molecular weight of at least 200 and a chlorine or bromine content of at least 50% by weight, (iii) 20–60 parts by weight of a poly(phenylene ether), (iv) 0–30 parts by weight of a polyunsaturated polymer having unsaturated carbon-carbon bonds, and (v) 2–10 parts by weight of a peroxide. Examples of polyunsaturated monomers include triallylcyanurate and triallylisocyanurate.

The aforementioned U.S. Pat. Nos. 3,557,045, 3,637,578, 3,936,414 do not teach the advantages of reactively capped polyphenylene ether, the advantages of low molecular weight reactively endcapped polyphenylene ethers and blends thereof with of diallylphthalate or styrenics with allylated cyanurates.

Penco in U.S. Pat. No. 5,171,761 describes a composition comprising 1) A polyphenylene ether (PPE) deriving from the (co)polymerization of one or more substituted phenols by oxidative coupling; 2) At least one mono-unsaturated monomer compound able to (co)polymerize in the presence of radical initiators; 3) Optionally, at least one polyunsaturated monomer compound able to (co)polymerize in the presence of radical initiators; 4) At least one radical polymerization initiator; 5) Possibly at least one (co)polymer with elastomeric characteristics; 6) Usual additives, stabilizers, accelerators and flame retardant agents. It is well known that oxidative polymerization produces polyphenylnene ethers with phenolic endgroups. Thus Penco teaches blends of hydroxyl terminated PPEs, or uncapped PPE, with vinyl monomer compositions. He teaches uncapped PPO having degrees of polymerization greater than 10 (number average molecular weight of approximately 1,200. But he teaches intrinsic viscosities of 0.54 dl/g. Further Penco teaches compositions comprising vinyl monomers such as styrenics and acrylics. He does not teach allylic monomers or blends of allylic monomers and styrenic monomers. They use styrenic and a divinylbenzene. He also does not demonstrat the significant thermal advantages of using a butylated stytrene.

The aforementioned U.S. Pat. Nos. 3,557,045, 3,637,578, 3,936,414 do not teach the advantages of reactively end-capped polyphenylene ether, the advantages of low molecular weight reactively endcapped polyphenylene ethers and blends thereof with of diallylphthalate or styrenics with allylated cyanurates. They also do not teach the thermal advantages of using a butylated stytrenes.

Katayose, et al. (U.S. Pat. No. 5,218,030) describes the use of (i) a poly(phenylene ether) containing pendant allyl or propargyl groups, (ii) triallylcyanurate or triallylisocyanurate, and optionally (iii) a flame retardant, or (iv) an antimony-containing auxiliary flame retardant. The poly(phenylene ether) compounds resins disclosed are uncapped poly(phenylene) ethers bearing terminal hydrogen groups.

Katayose, et al. (U.S. Pat. No. 5,352,745) disclose compositions with improved solvent resistance comprising a high molecular weight functionalized poly(phenylene ether) resin (=0.30–0.56 IV PPE) produced through reactive extrusion of poly(phenylene ether) with maleic anhydride. Formulation of (i) the reaction product of poly(phenylene ether) (PPE) with an unsaturated acid or acid anhydride with, (ii) triallylcyanurate or triallylisocyanurate, (iii) a brominated epoxy resin, (iv) novolac resins, and (v) a cure catalyst, produced flame retardant and solvent resistant resins useful in the production of printed circuit boards. Katayose, et al. show that a portion of the amino functionalized end groups contain capping residues. The skilled artisan would recognize that such end groups would comprise less than 10% of the hydroxyl end groups and would not be sufficient to significantly accelerate the cure rate of an allylic thermoset.

Tracy, et al. (U.S. Pat. No. 5,834,565) describe blends of low molecular weight poly(phenylene ether) compounds in thermosetting matrices such as epoxy cyanate ester and vinyl thermosets. These thermosetting compositions exhibit improved processability over analogous compositions containing high molecular weight poly(phenylene ether) compounds; however, capped poly(phenylene ether) resins are not taught or suggested by these references.

The aforementioned patents do not teach advantages of reactively end-capped polyphenylene ethers, like methacrylate capped poly(phenylene ether) and blends thereof with of vinyl monomers such as diallylphthalate or styrenics with allylated cyanurates. They also do not teach the thermal advantages of using a butylated stytrenes.

Percec, in U.S. Pat. Nos. 4,562,243, 4,663,402, 4,665,137, 4,701,514, 4,871,816, 5,091,480, describes the preparation of low molecular weight (number average molecular weight=1,000–10,000) cross-linkable polyphenylene ethers containing vinylbenzyl ethers and methacrylate end groups as thermosettable resins. However, blends of these polymers with vinyl monomers to produce thermosetting resins are not taught. In one of the these patents blends of reactively encapped PPO with vinyl monomers to form comb-copolymers is described, however such compositions are not thermosetting and would therefore would not be useful in printed circuit board or many thermoset molding applications. Further thermosetting blends of said resins with diallylphthalate or styrenics, such as brominated or butylated styrenics and blends thereof with allylated cyanurates are not taught.

None of the foregoing art recognizes the benefits of reactively endcapped poly(phenylene ether) compounds, e.g., methacrylate endcapped poly(phenylene ether) compounds in blends of vinyl monomer compositions to form easily processable thermosetting compositions. In particular blends with specific vinyl monomer compositions, such as those described herein, for thermosetting applications such as printed circuit boards or molding compositions. Inorganic reinforced compositions, including those comprising specific glass reinforcements with excellent dielectric properties are also not described.

BRIEF SUMMARY OF THE INVENTION

The capped poly(phenylene ether) resin composition comprises (1) a poly(phenylene ether) compound (PPE) in which at least a portion, preferably substantially all of the hydroxyl groups have been reacted with a compound containing ethylenic unsaturation (carbon-carbon double bonds) which is further reactive with unsaturated monomers (reactively endcapped PPE) and (2) a curable unsaturated monomer composition. The compositions of the invention have enhanced compatibility between the PPE and the curable unsaturated monomer composition when the compositions are at least partially cured. Enhanced compatibility includes, for example, enhanced dispersion of the PPE and reduced phase separation. Laminates of the compositions that have been at least partially cured, including copper clad laminates have highly desirable physical and dielectric properties.

In a preferred embodiment, the inventive composition comprises a reactively endcapped PPE having an Mn less than 10,000. It is further desirable that the endcap group is a methacrylate group which may be derived by reaction of a methacrylate containing compound and a poly(phenylene ether). The curable unsaturated monomer composition comprises a monomer or monomers selected from the group consisting of (a) a compound or compounds containing one polymerizable carbon-carbon double bond (monofunctional unsaturated compound) and (b) a compound or compounds containing greater than one polymerizable carbon-carbon double bond (polyfunctional unsaturated compound). For printed circuit board applications it is useful if at least one of the unsaturated monomers contains bromine or phosphorus.

Such composition optionally also may contain a polymerization catalyst; a flame-retardant compound; and fibrous reinforcement.

A further embodiment of this invention particularly useful for printed circuit boards is a composition comprising a methacrylate capped poly(phenylene ether), a brominated styrene compound, and an unsaturated monomer composition which may further include other additives such as, for example, a fibrous reinforcement.

The inventive composition may be used to impregnate fibrous reinforcement clad with copper to form an electrical circuit boards offering excellent dielectric and thermal properties, and accelerated rates of polymerization in formation of the PPE compositions. Moreover, such PPE compositions also can be made flame-retardant.

DETAILED DESCRIPTION OF THE INVENTION

The present invention relates to curable compositions comprising (1) a poly(phenylene ether) compound (PPE) in which all of the hydroxyl groups have been reacted with a compound containing ethylenic unsaturation which is further reactive with vinyl monomers (reactively endcapped PPE) and (2) a curable unsaturated monomer composition.

For processing considerations, it is desirable that the number average molecular weight of the reactively endcapped PPE is less than 10,000. It is further desirable that the endcap is a methacrylate group which may be derived by reaction of a methacrylate containing compound and a PPE resin. The curable unsaturated monomer composition comprises a monomer or monomers selected from the group consisting of (a) a compound or compounds containing one polymerizable carbon-carbon double bond and (b) a compound or compounds containing greater than one polymerizable carbon-carbon double bond. These materials are useful in a number of thermoset applications including, for example, adhesives, encapsulation, structural laminates, potting and casting compounds, extrudable thermosetting resins, printed circuit boards, and other applications in which low dielectric constant, dissipation factor, and/or good thermal properties are required. For printed circuit board applications the disclosed composition is highly useful if at least one of the unsaturated monomers contains bromine or phosphorus for achieving flame retardancy.

The reactively endcapped PPE compounds include compounds derived by reacting any of the known PPE compounds containing phenolic hydroxyl residues at a concentration of greater than about 5 ppm with a reactive capping agent. Such uncapped PPE compounds are described in a variety of patents and publications such as, for example, in U.S. Pat. Nos. 5,352,745, 5,213,886, and 5,834,565, the disclosures of which are expressly incorporated herein by reference.

The preferred reactively capped PPE compounds include those containing recurring units of structure 3. Most preferable poly(phenylene ether) compounds are of general structure 1:

wherein Q is the residuum of a phenol, including polyfunctional phenols, and includes radicals of the following structure, 2:

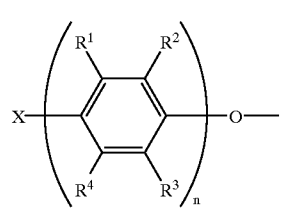

wherein, for structure 2, X is hydrogen, $C_{1-100}$ alkyl, aryl, and mixed alkyl-aryl hydrocarbons, or such hydrocarbon groups containing a substituent selected from the group consisting of carboxylic acid, aldehyde, alcohol, and amino radicals. X also may be sulfur, sulfonyl, sulfuryl, oxygen, or other such bridging group having a valency of 2 to result in various bis- or higher polyphenols. $R^{1-4}$ independently may be hydrogen, $C_{1-100}$ alkyl, aryl, mixed alkyl-aryl hydrocarbons, and the like; y and n independently range from about 1–100, preferably about 1–3, and most preferably about 1–2; and in one embodiment, y and n are the same; and J comprises recurring units of the following structure, 3:

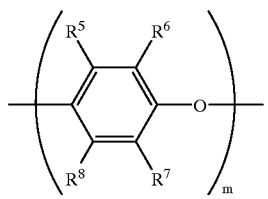

wherein, for structure 3, $R_{5-8}$ independently may be hydrogen, alkyl, alkenyl, alkynoyl, aryl, mixed alkyl-aryl hydrocarbons, or such groups also containing a substituent selected from the group consisting of carboxylic acid, aldehyde, alcohol, and amino functionality (e.g., amide or imide group), and m ranges from 1–200, and K has the following structure:

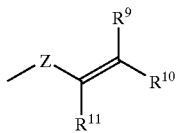

wherein Z is

and wherein $R^{9-11}$ are independently a hydrogen or $C_{1-100}$ alkyl or aryl or mixed alkyl or aryl group. Preferably, $R^{9-10}$ are hydrogen and $R^{11}$ is methyl.

Preferred reactively capped PPEs are low molecular weight PPEs with a number average molecular weight ranging from between about 250 to 10,000 g/mol. Desirably, the PPE contains low levels of amine containing end groups derived from well known catalyst side reactions. It is preferable to remove such amine containing end groups prior to reactively capping the PPE. Such materials may be prepared by processing the uncapped PPE at temperatures about 150° C. to about 350° C. followed by capping. Prior to capping, the low molecular weight polyphenylene ethers employed herein may be prepared from PPE typically having a number average molecular weights in the range of about 15,000–25,000.

Such preparation of a low molecular weight PPE composition can be accomplished by reacting the PPE with an oxidizing agent such as, for example, a peroxide or a quinone, with or without a phenol (including bisphenols). Another procedure is to obtain a low molecular weight PPE by oxidative coupling as described above to produce resins of less than 3,000 number average molecular weight which are isolated, preferably, by a direct isolation method. Direct isolation is a process in which the PPE resin is isolated from the solvent used in polymerization by heating under reduced pressure. However, even such low molecular weight resins can optionally be functionalized with a peroxide or a peroxide and a phenol to achieve even lower molecular weight resins.

A capping catalyst, is often employed in the generation of the reactively capped PPE. Examples of such compounds include those known to the art that are capable of catalyzing condensation of phenols with the capping agents described below. Useful materials are basic compounds including, for example, basic compound hydroxide salts such as sodium, potassium, or tetraalkylammonium hydroxides; or tertiary alkyl amines such as tributyl amine, triethylamine, dimethylbenzylamine, dimethylbutylamine and the like; tertiary mixed alkyl-arylamines and substituted derivatives thereof such as dimethylaniline; heterocyclic amines such as imidazoles or pyridines and substituted derivatives thereof such as 2-methylimidazole, 2-vinylimidazole, 4-(dimethylamino)pyridine, 2-, 3-, or 4-vinylpyridine. Also useful are organometallic salts such as, for example, tin and zinc salts known to catalyze the condensation of, for example, isocyanates or cyanate esters with phenols. The organometallic salts useful in this regard are known to the art in numerous publications and patents well known to those skilled in this art.

Capping agents include compounds known in the literature to react with phenolic groups, and which contain carbon-carbon unsaturation for curing into the thermoset matrix via polymerization of its unsaturation following the capping reaction. Such compounds include both monomers and polymers containing, for example, anhydride, acid chloride, epoxy, carbonate, ester, isocyanate, cyanate ester, or alkyl halide radicals. Capping agents are not limited to organic compounds as, for example, phosphorus and sulfur based capping agents also are included. Examples of such compounds include, for example, acrylic anhydride, methacrylic anhydride, glycidylacrylate or glycidylmethacrylate, acetyl chloride, benzoyl chloride, diphenyl such as di(4-nitrophenyl)carbonate, acryloyl, methacryloyl or acetyl esters, phenylisocyanate, 3-isopropenyl-dimethylphenylisocyanate, cyanatobenzene, 2,2-bis(4-cyanatophenyl)propane), 3- or 4-(-chloromethyl)styrene, allyl bromide, and the like, carbonate and substituted derivatives thereof and mixtures thereof.

In one embodiment, preferred capped poly(phenylene ether)s of the present invention include those of the general structure, 1:

$$Q\text{—}(J\text{—}K)_m \qquad\qquad 1$$

wherein Q is the residuum of a phenol;
J comprises recurring units of the following structure, 3:

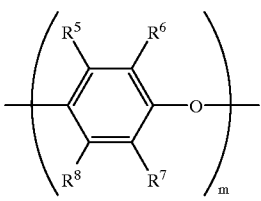

wherein, for structure 3, $R^{5-8}$ independently is selected from hydrogen, alkyl, alkenyl, alkynoyl, aryl, mixed alkyl-aryl hydrocarbons, wherein such groups may contain a substituent selected from carboxylic acid, aldehyde, alcohol, and amino functionality; K has the following structure:

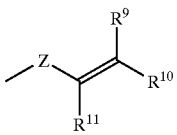

wherein $R^{9-11}$ is a hydrogen or $C_{1-100}$ alkyl or aryl or mixed alkyl or aryl group; X is an oxygen, and m ranges from 1–200.

Preferable capped poly(phenylene ether)s of the present invention include methacrylate capped polyphenylene ethers produced by reacting a poly(phenylene ether) with, for example, methacrylic anhydride in the presence of a capping catalyst. It is preferred that at least 10%, preferably at least 50%, and most preferably substantially all of the hydroxyl endgroups be capped.

A curable unsaturated monomer composition includes a member or members selected from the group consisting of (i) compounds containing a single polymerizable carbon-carbon double bond (monounsaturated compound) and (ii) compounds containing more than one polymerizable carbon-carbon double bond (polyunsaturated compound).

Mono-unsaturated compounds include, for example, monofunctional acrylate compounds and monofunctional styrenic compounds. Monofunctional acrylate compounds are compounds containing a single ethylenically unsaturated carbonyl group, i.e., a carbon-carbon double bond directly bonded to a carbonyl group. Representative of such compounds include, for example, methyl methacrylate, ethyl methacrylate, isopropyl methacrylate, n-butyl methacrylate, isobutyl methacrylate, 2-ethylhexyl methacrylate, 2-hydroxyethyl methacrylate, glycidyl methacrylate, 2,2-dimethyl-3-hydroxypropyl-2,2-dimethyl-3-hydroxypropenoate, isobornyl (meth)acrylate and tetrahydrofurfuryl methacrylate, halogenated acrylates such as pentabromobenzyl acrylate; and acrylic or methacrylic amides such methacrylamide, diacetone methacrylamide, N(beta-hydroxyethyl) methacrylamide.

Monofunctional styrenic compounds are compounds containing a single carbon-carbon double bond directly bonded to an aromatic or heterocyclic ring. Such compounds include, for example, styrene or 2- or 4-vinylpyridine or substituted derivatives thereof. The number of substituents may vary from between 1–5 and the substituent groups include $C_{1-100}$ alkyl, alkoxy, aryloxy, aryl, bromo, chloro, fluoro, alkylhalo, phosphonate, sulfonate, and substituted derivatives therefrom. Derivatives containing styrene and substituted derivatives therefrom include: alkylstyrenes such as styrene, methylstyrene, ethylstyrene, isopropylstyrene, tertiary-butylstyrene, phenylstyrene and halogenated styrenes such as chlorostyrene, dichlorostyrene, trichlorostyrene, bromostyrene, dibromostyrene, tribromostyrene, fluorostyrene, difluorostyrene, trifluorostyrene, tetrafluorostyrene and pentafluorostyrene, halogenated alkylstyrenes such as chloromethylstyrene, alkoxystyrenes such as methoxystyrene, ethoxystyrene. Monounsaturated compounds may be used alone or in combination.

Brominated styrene compounds are particularly useful for preparing flame retardant formulations. Preferably, the bromine content of the brominated styrene compound should be greater than 45%, advantageously greater than 60%, and preferably greater than 70% by weight. The high bromine content of the brominated styrene compound allows preparation of circuit boards that comply with UL-94 flammability while concomitantly maintaining high PPE content and optimal dielectric properties.

Compounds containing greater than one polymerizable carbon-carbon double bond are referred to as polyunsaturated compounds. Polyunsaturated compounds include, for example, polyfunctional allylic compounds, unsaturated polymers, polyfunctional acrylates or acrylamides, and polyfunctional styrenic compounds.

Polyfunctional allylic compounds are compounds containing more than one allyl group per molecule. Illustrative examples include diallylphthalate, diallylisophthalate, triallylmellitate, triallylmesate, triallylisocyanurate, triallylcyanurate, and partial polymerization products prepared therefrom.

Unsaturated polymers are polymeric resins with number average molecular weights of between about 200–100,000 and comprise repeat units which further contain carbon-carbon double bonds. Thus, the unsaturated polymer contains on average greater than one carbon-carbon double bond per molecule. Typical examples of such unsaturated polymers include butadiene and isoprene containing polymers and copolymers derived therefrom. The polybutadiene or polyisoprene resins may be liquid or solid at room temperature. While liquid polybutadiene and polyisoprene resins may have a molecular weight greater than 5,000, advantageously such resins have a molecular weight of less than 5,000 and preferably their molecular weight ranges from between about 1,000 and 3,000.

The preferably liquid (at room temperature) resin portion of the composition maintains the viscosity of the composition at a manageable level during processing. It is preferable for printed circuit board applications that the polybutadiene and polyisoprene resins having at least 85% 1,2 addition by weight in order to exhibit the greatest cross-link density upon cure due to the large number of pendent vinyl groups available for crosslinking. High cross-link densities are desirable for electrical circuit substrates which must exhibit superior high temperature properties. A preferred resin is a low molecular weight polybutadiene liquid resin having greater than 90 wt.-% 1,2 addition. Polybutadiene resins of this type include, for example, polybutadiene B3000 resin, commercially available from Nippon Soda, Ltd. In applications unrelated to printed circuit boards, lower levels of 1,2-addition product may be tolerated.

The unsaturated polymer also may contain a thermoplastic elastomer such as linear or graft-type block copolymers that preferably have a polybutadiene or polyisoprene block (preferably as a 1,2 addition product) and a thermoplastic block that preferably is styrene or alpha-methyl styrene. A preferred copolymer is a styrene-butadiene-styrene triblock copolymer, e.g., Kraton DX1300 (commercially available from Shell Chemical Corp.).

The thermoplastic elastomer also may contain a second block copolymer similar to the first except that the polybutadiene or polyisoprene block is hydrogenated, thereby forming a polyethylene block (in the case of polybutadiene) or an ethylene-propylene copolymer (in the case of polyisoprene). When used in conjunction with the first copolymer, materials with greater "toughness" can be produced. A preferred second block copolymer material is Kraton® GX1855 (commercially available from Shell Chemical Corp.) which is believed to be a mixture of styrene-high 1,2 butadiene-styrene block copolymer and styrene-(ethylene-propylene)-styrene block copolymer.

Also included as suitable thermoplastic elastomers are copolymers of primarily 1,2-addition butadiene or isoprene with styrene, alpha-methyl styrene, acrylate or methacrylate, or acrylonitrile monomers; homopolymers or copolymers of ethylene, such as polyethylene, ethylene-propylene copolymer and ethylene-propylene-diene terpolymers, ethylene-ethylene oxide copolymers; natural rubber; norbornene polymers such as polydicyclopentadiene; hydrogenated diene polymers such as hydrogenated styrene-isoprene-styrene copolymers and butadiene-acrylonitrile copolymers; and like elastomers.

Additional unsaturated polymers include unsaturated polyester resins which are the polycondensation reaction product of one or more dihydric alcohols and one or more ethylenically unsaturated polycarboxylic acids. By polycarboxylic acid is meant polycarboxylic or dicarboxylic acids or anhydrides, polycarboxylic or dicarboxylic acid halides, and polycarboxylic or dicarboxylic esters. For example, suitable unsaturated polycarboxylic acids, and the corresponding anhydrides and the acid halides that contain polymerizable carbon-to-carbon double bonds, may include maleic anhydride, maleic acid, and fumaric acid. A minor proportion of the unsaturated acid, up to about forty mole percent, may be replaced by dicarboxylic or polycarboxylic acid that does not contain a polymerizable carbon-to-carbon bond. Examples thereof include the acids (and corresponding anhydrides and acid halides): O-phthalic, isophthalic, terephthalic, succinic, adipic, sebasic, methylsuccinic, and the like. Dihydric alcohols that are useful in preparing the polyesters include, for example, 1,2-propane diol (hereinafter referred to as propylene glycol), dipropylene glycol, diethylene glycol, 1,3-butanediol, ethylene glycol, glycerol, and the like. Examples of suitable unsaturated polyesters are the polycondensation products of (1) propylene glycol and maleic and/or fumaric acids; (2) 1,3-butanediol and maleic and/or fumaric acids; (3) combinations of ethylene and propylene glycols (approximately 50 mole percent or less of ethylene glycol) and maleic and/or fumaric acids; and (4) propylene glycol, maleic and/or fumaric acids and dicyclopentadiene reacted with water. In addition to the above described polyesters, dicyclopentadiene modified unsaturated polyester resins as described by the Pratt, et al. (U.S. Pat. No. 3,883,612 incorporated herein by reference) may be used. The foregoing examples are intended to be illustrative of suitable polyesters and are not intended to be all-inclusive. The molecular weight of the polymerizable unsaturated polyester may vary over a considerable range, but ordinarily those polyesters useful in the practice of the present invention have a molecular weight ranging from about 300 to 5000, and more preferably, from about 500 to 5000.

Polyunsaturated compounds also include polyfunctional acrylate or polyfunctional acrylamide compounds. Polyfunctional acrylate compounds are compounds containing greater than one acrylate moiety per molecule. Illustrative examples include compounds produced by condensation of an acrylic or methacrylic acid with a di-epoxide, such as bisphenol-A diglycidyl ether or butanediol diglycidyl ether. Specific examples include 1,4-butanediol diglycidylether dimethacrylate, bisphenol A diglycidylether dimethacrylate, and neopentylglycol diglycidylether dimethacrylate acrylic and methacrylic esters. Also included as polyacrylates are the condensation of reactive acrylate or methacrylate compounds with alcohols or amines to produce the resulting polyfunctional acrylates or polyfunctional acrylamides. Examples include: N,N-bis(beta-hydroxyethyl) methacrylamide, methylenebismethacrylamide, 1,6-hexamethylenebis(methacrylamide), diethylenetriamine tris (methacrylamide), bis(gamma-(methacrylamide)propoxy) ethane, beta-(methacrylamide) ethylacrylate, ethylene glycol di(methacrylate), diethylene glycol di(methacrylate), tetraethylene glycol di(meth)acrylateglycerol di(methacrylate), glycerol tri(methacrylate), 1,3-propylene glycol di(methacrylate), dipropyleneglycol di(methacrylate), 1,4-butanediol di(methacrylate), 1,2,4-butanetriol tri (methacrylate), 1,6-hexanedioldi(methacrylate), 1,4-cyclohexanediol di(methacrylate), 1,4-benzenediol di(methacrylate), pentaerythritoltetra(methacrylate), 1,5-pentanediol di(methacrylate), trimethylolpropane di(meth) acrylate, trimethylolpropane tri(methacrylate), 1,3,5-triacryloylhexahydro-1,3,5-triazine, 2,2-bis(4-(2-acryloxyethoxy)phenyl)propane and 2,2-bis(4-(2-acryloxyethoxy)-3–5-dibromophenyl)propane, 2,2-bis(4-(2-methacryloxy-ethoxy)ph and 2,2-bis(4-(2-methacryloxyethoxy)-3–5-dibromophenyl) propane), 2,2-bis((4-acryloxy)phenyl)propane, 2,2-bis((4-methacryloxy) phenyl)propane and 2,2-bis((4-methacryloxy)-3,5-dibromophenyl)propane, 2,2-bis((4-methacryloxy)-3,5-dibromophenyl)propane.

Also included are polyfunctional styrenics (styrene compounds) which are compounds that contain greater than 1 carbon-carbon double bond directly attached to an aromatic or heterocyclic ring. These include, for example, 1,3-divinylbenzene, 1,4-divinylbenzene, trivinylbenzene, 1,3-diisopropenylbenzene, 1,4-diisopropenylbenzene, and halogenated derivatives thereof, as well as the vinylbenzylether of a polyphenol. Such compounds include the condensation products of chloromethylstyrene with a bisphenol, trisphenol or tetraphenol or more highly functionalized phenol. Such compounds include the bisvinylbenzyl ether of bisphenol-A, 3,3',5,5'-tetrabromobisphenol-A, biphenol, 4,4'-thiodiphenol, 4,4'-oxydiphenol, 2,2',4,4'-tetrabromo-3,3',5,5'-tetramethyl4,4-biphenol or the trisvinylether of 1,1,1-tris(4-hydroxyphenyl)ethane or the tetravinylether of 1,1,2,2-tetra(4-hydroxyphenyl)ethane or the polyfunctional vinylbenzylether formed by reaction of vinylbenzylchloride with a condensation product of phenol and formaldehyde such as a phenol-formaldehyde novolac.

In addition to the aforementioned components, curing catalysts for the unsaturated components also may be included. The curing agent for the unsaturated portion of the thermoset would include any compound capable of producing radicals at elevated temperatures. Such curing catalysts would include both peroxy and non-peroxy based radical initiators. Examples of peroxy initiators useful in the present invention include, for example, 2,5-dimethylhexane-2,5-dihydroperoxide, 2,5-dimethyl-2,5-di(t-butylperoxy)-hex-3-yne, di-t-butylperoxide, t-butylcumyl peroxide, '-bis(t-butylperoxy-m-isopropyl)benzene, 2,5-dimethyl-2,5-di(t-butylperoxy)hexane, dicumylperoxide, di(t-butylperoxy isophthalate, t-butylperoxybenzoate, 2,2-bis(t-butylperoxy) butane, 2,2-bis(t-butylperoxy)octane, 2,5-dimethyl-2,5-di (benzoylperoxy)hexane, di(trimethylsilyl)peroxide, and trimethylsilylphenyltriphenylsilyl peroxide and the like. Typical non-peroxy initiators include compounds such as, for example, 2,3-dimethyl-2,3-diphenylbutane, 2,3-trimethylsilyloxy-2,3-diphenylbutane, and the like.

The aforementioned formulations also may be cured using irradiation techniques and would contain the aforementioned catalysts or those for such electron beam curing. Typical examples are electron beam and UV radiation.

PPE in which substantial portion, preferably substantially all, of the hydroxyl groups have been reacted with a compound containing ethylenic unsaturation may be blended with the unsaturated monomers either by dissolving the capped PPE in the unsaturated monomer resin or dispersing the capped PPE as a particulate of particle size 0.5–300 microns in size. Such an approach is particularly advantageous in blends of the capped PPE with allylic and/or styrenic monomers.

In an advantageous embodiment, (I) the poly(phenylene ether) and capping agent are combined with a capping catalyst which is combined with (II) a compound containing a polymerizable carbon-carbon double bond or triple bond, and optionally a member selected from (Ill) a polymerization catalyst, (IV) a flame retardant, and (V) a fibrous reinforcement. Compound (II) may comprise a member selected from (a) a compound containing on average one polymerizable carbon-carbon double bond or triple bond and (b) a compound containing on average greater than one polymerizable carbon-carbon double or triple bond. Such formulations are thermosettable and can provide improved solvent resistance.

Flame retardant compounds include those known to the art as described in numerous publications and patents known to those skilled in this art. Useful in formulating flame retardant compositions are, for example, brominated flame retardant compounds. Preferred brominated flame retardant compounds include, for example, 1,3,5-tris(2,4,6-tribromophenoxy)triazine, polybrominated diphenyl ethers, poly(2,6-dibromophenylene ether), brominated polystyrene, brominated cyclododecane, brominated bisphenol-A diglycidyl ether, hydroxyethyl ether, $C_{1-100}$ aromatic or mixed aromatic-aliphatic phosphate esters such as triphenyl, tricresyl phosphate, tris(2-allylphenylphosphate), tris(2- methoxy-4-allylphosphate), tris(2-propenylphenyl) phosphate, tris(4-vinylphenyl)phosphate bis (diphenylphosphate ester)s of bisphenols such as bisphenol-A, resorcinol or hydroquinone or the bis(diphenyl phosphoramide)s of diamines such as 1,6-hexanediamine or piperidine, and alkylated or substituted derivatives therefrom. If brominated flame retardants are used, it is preferred that the bromine content of the brominated flame retardant be greater than 45%, advantageously greater than 60%, and preferably greater than 70%. The high bromine content of the flame retardant allows one to obtain UL-94 flammability and at the same time maintaining high PPE content and optimal dielectric properties.

Synthetic and/or natural resins can be used to further modify the properties of the compositions. Examples of the synthetic or natural resins for changing the properties include thermosetting resins, such as polyester resin, phenol resin, acrylic resin, urethane resin, silicone resin and alkyd resin; unvulcanized rubbers, such as polybutadiene, butadiene-acrylonitrile copolymer, polychloroprene butadiene-styrene copolymer, polyisoprene, butyl rubber, natural rubbers; thermoplastic resins or low molecular resin having a molecular weight of less than several thousands, such as thermoplastic urethane resin, polyvinyl acetal resin and vinyl acetate resin; oligomers having a molecular weight of less than several thousands, such as polycarbonate, thermoplastic polyester, polyester-carbonate, polyphenylene ether, polyslfone, polyether sulfone, and polyacrylate which are engineering plastics; polyolefins having a molecular weight of less than several thousands, such as polyethylene, polypropylene, polybutene, and poly-4-methylpentene-1; and fluoroplastics having an molecular weight of less than several thousands, such as polytetrafluoro ethylene, tetrafluoro-propylene copolymer, perfluoroethylene-propylene copolymer, and fluoro-vinylidene.

Examples of fillers include silica powder, such as fused silica and crystalline silica boron-nitride powder and boron-silicate powders for obtaining cured products having low dielectric constant and low dielectric loss tangent; the above-mentioned powder as well as alumina, and magnesium oxide (or magnesia) for high temperature conductivity; and fillers, such as wollastonite, mica, calcium carbonate and talc or hollow glass microspheres, buckminsterfullanes, conductive carbon fibrils, nanotubes and xerogels. These inorganic fillers can be added to the thermosetting resin without any treatment, or after surface treatment by a silane coupling agent, or a titanate coupling agent. The fillers can be used in the form of particles or fiber. Organic fillers such as thermoplastics may also be used. Examples of thermoplastics include powdery engineering resins, such as polycarbonate, thermoplastic polyester, polyestercarbonate, polyphenylene ether, polysulfone, polyether sulfone, and polyacrylate; powdery polyolefins, such as polyethylene, polypropylene and poly-4-methyl pentene-1; and fluoroplastics, such as polytetrafluoro ethylene, tetrafluoro-ethylenerpropylene copolymer, and perfluoroethylene-propylene copolymer.

Reinforcements known to one skilled in the art can be used, including but not limited to, inorganic and organic materials, such as woven or non-woven glass fabrics of the E-, NE-, S-, T- and D-type glasses and quartz, and the like. Reinforcement may be in the form of glass roving cloth, glass cloth, chopped glass, hollow glass fibers, glass mat, glass surfacing mat, and non-woven glass fabric, ceramic fiber fabrics, and metallic fiber fabrics. Of particular value are glasses which have a very low dissipation factor, broadly less than 0.0015, advantageously less than 0.0010, and preferably less than 0.0007 measured at 1 MHz. Glasses with suitable a dissipation factor are for the most part are comprised of various combinations of $Al_2O_3$, $SiO_2$, CaO, $B_2O_3$, MgO, and trace amounts (generally less than 2 parts by weight) of other oxide species. The weight ratios of $Al_2O_3$, $SiO_2$, CaO, $B_2O_3$, MgO, and trace oxide species may vary over a wide range well-known to those skilled in the art to produce glasses with suitable dissipation factors. Preferred glasses are E-, NE-, D- and S-type glasses.

For many applications desirable glasses comprise about 12–30 parts $Al_2O_3$, about 45–70 parts $SiO_2$, about 0.3–32 parts CaO, and about 2–24 parts $B_2O_3$, all parts being parts by weight. Especially desirable glasses comprise about 15–20 parts $Al_2O_3$, about 50–64 parts $SiO_2$, about 5–10 parts CaO, and about 15–20 parts $B_2O_3$, all parts being parts by weight. In addition, synthetic organic reinforcing fillers may also be used in the present invention including, for example, organic polymers capable of forming fibers. Illustrative examples of such reinforcing organic fibers include, for example, poly(ether ketone), polyimide benzoxazole, poly (phenylene sulfide), polyesters, aromatic polyamides, aromatic polyimides or polyetherimides, acrylic resins, and poly(vinyl alcohol).

Fluoropolymers, such as polytetrafluoroethylene, can be used in the present invention also. Further included as reinforcement are natural organic fibers known to those skilled in the art, including cotton cloth, hemp cloth, felt, carbon fiber fabrics, and natural cellulosic fabrics such as Kraft paper, cotton paper; and glass fiber containing paper. Such reinforcing fillers may be provided in the form of monofilament or multifilament fibers and can be used either alone or in combination with other types of fiber, through, for example, co-weaving or core/sheath, side-by-side, orange-type or matrix and fibril constructions, or by other methods known to one skilled in the art of fiber manufacture. Such fillers may be supplied in the form of, for example, woven fibrous reinforcements, non-woven fibrous reinforcements, or papers.

Coupling agents, incorporated into the reinforcing material, are known in the art to improve adhesion of the fibrous reinforcement to the cured resin composition and through said incorporation are considered to an integral part of it. For purposes of the present invention, representative coupling agents include, for example, silane-, titanate-, zirconate-, aluminum-, and zircoaluminum-based coupling agents, as well as other agents known to those skilled in the art.

The composition may be cured to the desired degree by any of a number of techniques known to those skilled in the art, including, for example, heating, exposure to light or to an electron beam. When heat curing is used, the temperature selected can range from about 80° to about 300° C., and preferably from about 120° to about 240° C. The heating period can range from as short as about 1 minute to as long as about 10 hours, though such heating period advantageously ranges from about 1 minute to about 6 hours, and preferably ranges from about 3 hours to about 5 hours. Such curing may be staged to produce a partially cured and often tack-free resin which then is fully cured by heating for longer periods or temperatures within the aforementioned ranges.

Among the fillers that may be present in the composition are the following: particulate fillers such as talc, clay, mica, silica, alumina, and calcium carbonate. In addition, fillers may include conventional flame retardant additives such as bromine and phosphorus compounds, such as, for example: alkyl tetrabromophthalates and/or epichlorohydrin reaction products with mixtures of bisphenol A and tetrbromobisphenol A. Also included as fillers are plasticizers and/or flow promoters such as, for example, alkyl tetrabromophthalates, and fabric wettability enhancers (e.g., wetting agents and coupling agents). Even polar liquids such as n-butyl alcohol, methyl ethyl ketone, polysiloxanes, and tetrahydrofuran, may be advantageous under certain conditions. Also included as fillers are antioxidants, thermal and ultraviolet stabilizers, lubricants, antistatic agents, dyes, and pigments. The aforementioned filler materials may be used alone or in combination for purposes of the present invention.

The curable compositions of the invention may be dissolved in an effective amount of an inert organic solvent, typically to a solute content of about 30%–60% by weight. The identity of the solvent is not critical, provided that it may be removed by suitable means such as evaporation. Aromatic hydrocarbons, especially toluene, are preferred. The order of blending and dissolution also is not critical; however, in order to avoid premature curing, catalyst and hardener components generally should not be brought initially into contact with polyphenylene ether and polymerizable monomer composition at a temperature above about 60° C. Proportions of components and bromine herein do not include solvent.

In this application all amounts and proportions are by weight and units are in the metric system, unless otherwise indicated.

EXAMPLE 1

To a solution of 3 L of toluene in a 5-liter 3-necked round bottom flask was added 1500 g of PPE resin (intrinsic viscosity=0.15 dl/g), 153 g (1.0 mol) of methacrylic anhydride, and 121 g (1.0 mol) of dimethylaminopyridine. The solution was heated at reflux overnight. The desired product was precipitated into methanol and isolated by filtration. The resulting product was dried at 80° C. overnight in vacuo. The yield of product was 1333 g. 1H-NMR data was consistent with the methacrylate capped PPE resin.

EXAMPLE 2

40 g of the aforementioned resin was dissolved in 100 ml of toluene and further formulated with the corresponding vinyl monomers outlined in Table 1. The resin solutions then were impregnated into 7628 style E-glass cloth, and the impregnated cloth was heated in an air circulating oven at 140° C. for 2–5 minutes to remove the solvent and partially cure the thermoset resin. Eight of the partially cured (B-staged) prepregs were layered and cured in a press at 200° C. for 2 hours. The properties of the resulting laminates are shown in Table 1.

TABLE 1

| FORMULATION | 1 | 2 | 3 |
|---|---|---|---|
| Component A |  |  |  |
| MAA capped PPE (0.12 IV) | 70 | 40 | 40 |
| Component B(I) |  |  |  |
| Dibromostyrene | 28 | 40 | 40 |
| Component B(II) |  |  |  |
| Triallylisocyanurate |  | 17 |  |
| Triallylmesate |  |  | 17 |
| Divinylbenzene |  |  |  |
| Cure Catalyst: |  |  |  |
| 2,5-dimethyl-2,5-di(t-butylperoxy)-hex-3-yne | 2 | 3 | 3 |
| Properties: |  |  |  |
| Tg (DMA, ° C.) | 197 | 199 | 194 |
| Tg (TMA, ° C.) | 175 | 192 | 188 |
| CTE (<Tg, ppm) | 42 | 42 | 49 |
| CTE (> Tg, ppm) | 271 | 298 | 336 |
| MeCl$_2$ resistance (30 min, RT) | Slight Degradation | No Degradation | No Degradation |
| Solder Resistance (280° C.) |  |  |  |
| % Bromine | 17.8 | 25.5 | 25.5 |
| UL-94 Flammability | V-1 | V-0 | V-0 |
| Dielectric Constant (1 MHz) | 3.86 | 5.07 | 4.50 |
| Dissipation Factor (1 MHz) | 0.0024 | 0.0065 | 0.0053 |

The above-tabulated data reveals the preparation of high flame retardant resins having high Tg values, low dissipation factors, and dielectric constants. Such properties are beneficial for printed circuit board applications.

EXAMPLE 3

Methacrylate capped PPE from Example 1 was dissolved in an appropriate vinyl monomer shown in Table 2 at temperatures between 80° and 140° C. The resulting resin was resin transfer molded into 16"×16"×0.125" mold. The resin was cured at 150° C. for 45 minutes and 200° C. for 45 minutes. The glass transition temperatures and coefficients of thermal expansion (−30 to 80° C.) of the resins are shown in Table 2.

TABLE 2

| FORMULATION | 1 | 2 | 3 | 4 | 5 | 6 | 7 | 8 |
|---|---|---|---|---|---|---|---|---|
| Component A |  |  |  |  |  |  |  |  |
| MAA capped PPE(0.15 IV) | 40 | 48.5 | 40 | 40 | 40 | 50 | 49.9 | 48.5 |
| Component B(I) |  |  |  |  |  |  |  |  |
| Methyl Styrene |  |  | 40 | 40 |  | 40 |  | 40 |
| t-butyl Styrene | 40 |  |  |  |  |  | 49.9 |  |
| Component B(II) |  |  |  |  |  |  |  |  |
| Tetramethylolpropane tetraacrylate |  |  |  |  |  |  | 7 |  |
| Diallylphthalate |  | 48.5 |  |  |  | 40 |  | 48.5 |
| Hexanedioldimethacrylate |  |  |  | 17 |  |  |  |  |
| Triallylcyanurate | 17 |  | 17 |  | 17 |  |  |  |

TABLE 2-continued

| FORMULATION | 1 | 2 | 3 | 4 | 5 | 6 | 7 | 8 |
|---|---|---|---|---|---|---|---|---|
| Cure Catalyst: | | | | | | | | |
| 2,5-dimethyl-2,5-di(t-butylperoxy)-hex-3-yne | 3 | 3 | 3 | 3 | 3 | 3 | 0.2 | 3 |
| Properties: | | | | | | | | |
| Tg (DMA,° C.) | 197 | 190 | 167 | 137 | 210 | 159 | 186 | 191 |
| CTE (×10$^{-5}$ ° C.$^{-1}$) | 7.32 | — | — | 8.20 | 6.22 | 7.76 | — | 6.70 |

These results again demonstrate the efficacy of the composition in producing molding compositions with high Tg and low coefficients of thermal expansion.

What is claimed is:

1. A curable poly(phenylene ether) composition which comprises:

(a) a poly(phenylene ether) containing hydroxyl endgroups that have been capped with a compound containing ethylenic unsaturation; wherein the poly(phenylene ether) has the structure Q—(J—K)$_y$, wherein Q has the structure

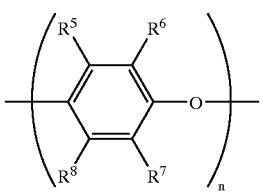

wherein X is hydrogen; $R^{1-4}$ are independently hydrogen, $C_{1-100}$ alkyl, $C_{1-100}$ aryl, or $C_{1-100}$ mixed alkyl-aryl hydrocarbon; and n is 1;

wherein J has the structure

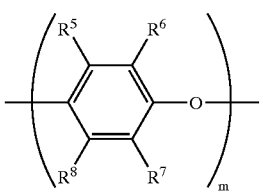

wherein $R^{5-8}$ are independently hydrogen, unsubstituted or substituted alkyl, unsubstituted or substituted alkenyl, unsubstituted or substituted alkynoyl, unsubstituted or substituted aryl, or unsubstituted or substituted mixed alkyl-aryl hydrocarbons, wherein substituents may be selected from the group consisting of carboxylic acid, aldehyde, alcohol, and amino; and m is 1–200;

wherein K has the structure

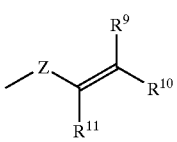

wherein Z is

and wherein each of $R^{9-11}$ is independently hydrogen, $C_{1-100}$ alkyl, $C_{1-100}$ aryl, or $C_{1-100}$ mixed alkyl-aryl; and wherein y is 1;

wherein at least 10% of the hydroxyl groups have been capped; and (b) a curable unsaturated monomer comprising one or more of a monofunctional styrenic compound, a polyfunctional styrenic compound, a monofunctional acrylate compound, a polyfunctional acrylate compound, or a polyfunctional acrylamide compound.

2. The curable poly(phenylene ether) composition of claim 1, wherein component (a) comprises a poly(phenylene ether) capped with a methacrylate or acrylate moiety.

3. The curable poly(phenylene ether) composition of claim 1, wherein the capped poly(phenylene ether) of component (a) comprises a poly(phenylene ether) with a number average molecular weight ranging from between about 250 to 10,000 g/mol.

4. The curable poly(phenylene ether) composition of claim 1, wherein the compound containing ethylenic unsaturation is selected from the group consisting of acrylic anhydride, and methacrylic anhydride.

5. The curable poly(phenylene ether) composition of claim 1, wherein at least 50% of the hydroxyl endgroups have been capped.

6. The curable poly(phenylene ether) composition of claim 1, wherein substantially all of the hydroxyl endgroups have been capped.

7. The curable poly(phenylene ether) composition of claim 1, wherein the poly(phenylene ether) has been processed at temperatures between about 150° C. and 350° C. prior to capping the hydroxyl endgroups.

8. The curable poly(phenylene ether) composition of claim 1, wherein the poly(phenylene ether) prior to capping contains phenolic hydroxyl residues at a concentration greater than about 5 ppm.

9. The curable poly(phenylene ether) composition of claim 1 further comprising a polymerization catalyst.

10. The curable poly(phenylene ether) composition of claim 1, wherein the poly(phenylene ether) prior to capping comprises a poly(phenylene ether) with a number average molecular weight ranging from between about 15,000 to 25,000 g/mol.

11. The curable poly(phenylene ether) composition of claim 1 further comprising a peroxide.

12. The curable poly(phenylene ether) composition of claim 1, wherein the poly(phenylene ether) prior to capping comprises poly(2,6-dimethylphenylene ether) resin.

13. The curable poly(phenylene ether) composition of claim 1, wherein the poly(phenylene ether) comprises a poly(phenylene ether) wherein $R^6$ and $R^7$ are each methyl and $R^5$ and $R^8$ are each hydrogen or a mixture of hydrogen and methyl.

14. The curable poly(phenylene ether) composition of claim 1, wherein component (b) comprises at least one of monofunctional acrylate compounds and monofunctional styrenic compounds.

15. The curable poly(phenylene ether) composition of claim 1, wherein component (b) comprises at least one of a polyfunctional styrenic compound, a polyfunctional acrylate compound, or a polyfunctional acrylamide compound.

16. The curable poly(phenylene ether) composition of claim 1, wherein component (b) comprises at least one polyfunctional acrylate compound or polyfunctional acrylamide compound.

17. The curable poly(phenylene ether) composition of claim 1, wherein component (b) comprises at least one of N,N-bis(beta-hydroxyethyl)methacrylamide, methylenebismethacrylamide, 1,6-hexamethylenebis (methacrylamide), diethylenetriamine tris(methacrylamide), bis(gamma-(methacrylamide)propoxy) ethane, beta-(methacrylamide) ethylacrylate, ethylene glycol di(methacrylate), diethylene glycol di(methacrylate), tetraethylene glycol di(meth)acrylateglycerol di(methacrylate), glycerol tri(methacrylate), 1,3-propylene glycol di(methacrylate), dipropyleneglycol di(methacrylate), 1,4-butanediol di(methacrylate), 1,2,4-butanetriol tri (methacrylate), 1,6-hexanediol di(methacrylate), 1,4-cyclohexanediol di(methacrylate), 1,4-benzenediol di(methacrylate), pentaerythritoltetra(methacrylate), 1,5-pentanediol di(methacrylate), trimethylolpropane di(meth)acrylate, trimethylolpropane tri(methacrylate), 1,3,5-triacryloylhexahydro-1,3,5-triazine, 2,2-bis(4-(2-acryloxyethoxy)phenyl)propane and 2,2-bis(4-(2-acryloxyethoxy)-3-5-dibromophenyl)propane, 2,2-bis(4-(2-methacryloxy-ethoxy)phenyl)propane and 2,2-bis(4-(2-methacryloxyethoxy)-3-5-dibromophenyl) propane), 2,2-bis((4-acryloxy)phenyl)propane, 2,2-bis((4-methacryloxy) phenyl)propane and 2,2-bis((4-methacryloxy)-3,5-dibromophenyl)propane, 2,2-bis((4-methacryloxy)-3,5-dibromophenyl)propane.

18. The curable poly(phenylene ether) composition of claim 1, wherein component (a) comprises a capped poly (phenylene ether) as a particulate having a particle size of 0.5–300 microns.

19. The curable poly(phenylene ether) composition of claim 1, wherein component (a) is dissolved in component (b).

20. The curable poly(phenylene ether) composition of claim 1, further comprising at least one of silica powder, alumina, magnesium oxide, wollastonite, mica, calcium carbonate, talc, hollow glass microspheres, buckminsterfullanes, conductive carbon fibrils, nanotubes, xerogels, and glass fibers.

21. The curable poly(phenylene ether) composition of claim 1, further comprising an inert organic solvent.

22. The curable poly(phenylene ether) composition of claim 1, which has been at least partially cured.

23. An adhesive composition made from the curable poly(phenylene ether) composition of claim 1.

24. A potting composition made from the curable poly (phenylene ether) composition of claim 1.

25. A casting composition made from the curable poly (phenylene ether) composition of claim 1.

26. An extrudable composition made from the curable poly(phenylene ether) composition of claim 1.

27. A printed circuit board composition made from the curable poly(phenylene ether) composition of claim 1.

28. An encapsulation composition made from the curable poly(phenylene ether) composition of claim 1.

29. A structural composite composition made from the curable poly(phenylene ether) composition of claim 1.

30. A curable poly(phenylene ether) composition which comprises:
(a) a poly(phenylene ether) containing hydroxyl endgroups that have been capped with a compound containing ethylenic unsaturation; wherein the poly (phenylene ether) has the structure Q—(J—K)$_y$ wherein Q has the structure

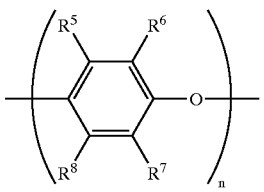

wherein X is hydrogen; $R^{1-4}$ are independently hydrogen, $C_{1-100}$ alkyl, $C_{1-100}$ aryl or $C_{1-100}$ mixed alkyl-aryl hydrocarbon; and n is 1;
wherein J has the structure

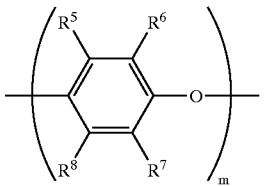

wherein $R^{5-8}$ are independently hydrogen, unsubstituted or substituted alkyl, unsubstituted or substituted alkenyl, unsubstituted or substituted alkynoyl, unsubstituted or substituted aryl, or unsubstituted or substituted mixed alkyl-aryl hydrocarbons wherein substituents may be selected from the group consisting of carboxylic acid, aldehyde, alcohol, and amino; and m is 1–200;
wherein K is an acrylate or methacrylate group; and wherein y is 1;
wherein at least 10% of the hydroxyl groups have been capped; and
(b) a curable unsaturated monomer comprising at least one of styrene, t-butyl styrene and methylstyrene.

31. The curable poly(phenylene ether) composition of claim 30 further comprising a polymerization catalyst.

32. The curable poly(phenylene ether) composition of claim 30, wherein component (b) further comprises at least one polyfunctional acrylate compound or polyfunctional acrylamide compound.

33. The curable poly(phenylene ether) composition of claim 30, wherein component (a) comprises a capped poly (phenylene ether) present as a particulate having a particle size of 0.5–300 microns.

34. The curable poly(phenylene ether) composition of claim 30, wherein component (a) is dissolved in component (b).

35. The curable poly(phenylene ether) composition of claim 30, wherein the poly(phenylene ether) has been processed at temperatures between about 150° C. and 350° C. prior to capping the hydroxyl endgroups.

36. The curable poly(phenylene ether) composition of claim 30, wherein the capped poly(phenylene ether) of component (a) comprises a poly(phenylene ether) with a number average molecular weight ranging from between about 250 to 10,000 g/mol.

37. A curable poly(phenylene ether) composition which comprises:
(a) a poly(phenylene ether) containing hydroxyl endgroups that have been capped with a compound containing ethylenic unsaturation; wherein tbe poly (phenylene ether) has the structure Q—(J—K)$_y$ wherein Q has the structure

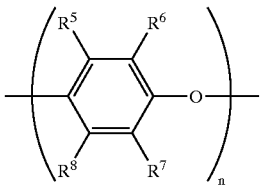

wherein X is hydrogen; $R^2$ and $R^3$ are methyl; $R^1$ and $R^4$ are independently hydrogen or methyl; and n is 1;
wherein J has the structure

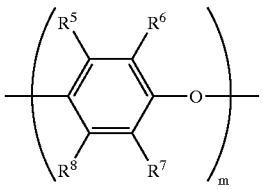

wherein $R^6$ and $R^7$ are methyl; $R^5$ and $R^8$ are independently hydrogen or methyl; and m is 1–200;
wherein K is an acrylate or methacrylate group; and wherein y is 1;
wherein the poly(phenylene ether) has a number average molecular weight ranging from between about 250 to 10,000 g/mol;
wherein at least 10% of the hydroxyl groups have been capped; and
(b) a curable unsaturated monomer comprising one or more of a monofunctional styrenic compound, a polyfunctional styrenic compound, a monofunctional acrylate compound, a polyfunctional acrylate compound, or a polyfunctional acrylamide compound.

38. The curable polythenylene ether) composition of claim 37, wherein component (b) comprises (b1) at least one of a monofunctional styrenic compound or a monofunctional acrylate compound, and (b2) at least one of a polyfunctional styrenic compound, a polyfunctional acrylate compound, or a polyfunctional acrylamide compound.

39. The curable poly(phenylene ether) composition of claim 38, wherein the monofunctional styrenic compound is selected from the group consisting of a of styrene, methyl styrene, alpha-methyl styrene, and t-butylstyrene; and wherein the monofunctional acrylate compound is selected from the group consisting of methyl methacrylate, (2-hydroxyethyl)methacrylate, butylmethacrylate, and ethylhexylmethacrylate.

40. The curable poly(phenylene ether) composition of claim 38, wherein the polyfunctional acrylate compound comprises at least one compound selected from the group consisting of ethylene glycol di(methacrylate), diethylene glycol di(methacrylate), tetraethylene glycol di(meth) acrylate, glycerol di(methacrylate), glycerol tri (methacrylate), 1,3-propylene glycol di(methacrylate), dipropyl eneglycol di(methacrylate), 1,4-butanediol di(methacrylate), 1,2,4-butanetriol tri(methacrylate), 1,6-hexanedioldi(methacrylate), 1,4-cyclohexanediol di(methacrylate), 1,4-benzenediol di(methacrylate), pentaerythritoltetra(methacrylate), 1,5-pentanediol di(methacrylate), trimethylolpropane di(meth)acrylate, trimethylolpropane tri(methacrylate), and 1,3,5-triacryloylhexahydro-1,3,5-triazine; and wherein the polyfunctional styrenic compound comprises at least one compound selected from the group consisting of 1,3-divinylbenzene, 1,4-divinylbenzene, trivinylbenzene, 1,3-diisopropenylbenzene, and 1,4-diisopropenylbenzene.

41. The curable poly(phenylene ether) composition of claim 38, wherein component (b2) comprises at least one of trimethylolpropane triacrylate or trimethylolpropane trimethacrylate.

42. The curable poly(phenylene ether) composition of claim 37, further comprising at least one polymerization initiator.

43. The curable poly(phenylene ether) composition of claim 37, wherein component (b) comprises styrene and a polyunsaturated acrylate, a polyunsaturated methacrylate, or mixture thereof.

44. The curable poly(phenylene ether) composition of claim 37, further comprising at least one member of the group consisting of calcium carbonate, magnesium oxide, hollow glass microspheres, chopped glass fibers, glass mats, woven glass fibers, carbon fibers, mica, fused silica, crystalline silica, boron-nitride, boron-silicate powder, alumina, wollastonite, talc, and conductive carbon fibrils.

45. The curable poly(phenylene ether) composition of claim 37, wherein component (b) comprises a mixture of two or more compounds selected from the group consisting of monofunctional styrenic compounds, difunctional styrenic compounds, monofunctional acrylate compounds, difunctional acrylate compounds, and trifunctional acrylate compounds.

46. The curable poly(phenylene ether) composition of claim 37, wherein component (a) comprises 40 to 70 parts per hundred resin, and component (b) comprises 28 to 49.9 parts per hundred resin of at least one of the monofunctional styrenic compound or monofunctional acrylate compound, and 7 to 17 parts per hundred resin of at least one of the polyfuntional styrenic compound, polyfunctional acrylate compound, or polyfunctional acrylamide compound.

47. The curable poly(phenylene ether) composition of claim 46, further comprising 0.2–3% parts per hundred resin of at least one polymerization initiator.

48. The curable poly(phenylene ether) composition of claim 47, which has been at least partially cured.

49. The curable poly(phenylene ether) composition of claim 37, which has been at least partially cured.

50. An adhesive composition made from the curable poly(phenylene ether) composition of claim 37.

51. A potting composition made from the curable poly (phenylene ether) composition of claim 37.

52. A casting composition made from the curable poly (phenylene ether) composition of claim 37.

53. An extrudable composition made from the curable poly(phenylene ether) composition of claim 37.

54. A printed circuit board composition made from the curable poly(phenylene ether) composition of claim 37.

55. An encapsulation composition made from the curable poly(phenylene ether) composition of claim 37.

56. A structural composite composition made from the curable poly(phenylene ether) composition of claim 37.

* * * * *

UNITED STATES PATENT AND TRADEMARK OFFICE
CERTIFICATE OF CORRECTION

| | | |
|---|---|---|
| PATENT NO. | : 6,617,398 B2 | Page 1 of 4 |
| APPLICATION NO. | : 09/943342 | |
| DATED | : September 9, 2003 | |
| INVENTOR(S) | : Gary W. Yeager et al. | |

It is certified that error appears in the above-identified patent and that said Letters Patent is hereby corrected as shown below:

Title Page,
Item (73) Assignee, delete "Pittsfield, MA" and insert therefor --Schenectady, NY--.

Column 2,
Line 54, after "such", delete "a" and insert therefor --as--.
Line 59, after "containing", delete "a".

Column 3,
Line 2, after "having", insert --a--.
Line 52, after "not", delete "demonstrat" and insert therefor --demonstrate--.
Line 62, after "using", delete "a".
Line 62, after "butylated", delete "stytrenes." and insert therefor --styrenes.--

Column 4,
Line 1, after "(phenylene ether)" delete "compounds" and insert therefor --compound--.
Line 30, after "with", delete "of".
Line 33, after "butylated", delete "stytrenes" and insert therefor --styrenes.--
Line 44, after "and", delete "would".

Column 5,
Line 40, after "circuit", delete "boards" and insert therefor --board--.

Column 6,
Line 61, after "3," delete "$R_{5-8}$" and insert therefor --$R^{5-8}$--.

Column 7,
Line 29, after "molecular", delete "weights" and insert therefor --weight--.

Column 8,
Line 14, after "or", delete "4-(-chloromethyl)" and insert therefor --4-(chloromethyl)--.

Column 11,
Line 53, after "methacryloxy-ethoxy)", delete "ph" and insert therefor
--phenyl)propane--.

Column 12,
Line 5, after "tetramethyl", delete "4,4-biphenol" and insert therefor -- -4,4-biphenol --.
Line 47, after "from", delete "(I11)" and insert therefor --(III)--.

UNITED STATES PATENT AND TRADEMARK OFFICE
CERTIFICATE OF CORRECTION

PATENT NO. : 6,617,398 B2
APPLICATION NO. : 09/943342
DATED : September 9, 2003
INVENTOR(S) : Gary W. Yeager et al.

It is certified that error appears in the above-identified patent and that said Letters Patent is hereby corrected as shown below:

Column 13,
Line 28, after "ether", delete "polyslfone" and insert therefor --polysulfone--.
Line 32, after "having", delete "an" and insert therefor --a--.
Line 33, after "as", delete "polytetrafluoro ethylene" and insert therefor --polytetrafluoroethylene--.
Line 55, after "as", delete "polytetrafluoro ethylene" and insert therefor --polytetrafluoroethylene--.
Lines 55/56, after "ethylene", delete "tetrafluoroethylenerpropylene" and insert therefor --tetrafluoroethylene-propylene--.

Column 14,
Line 2, after "with", delete "suitable a" and insert therefor --a suitable--.
Line 2, after "part", delete "are".

Column 15,
Line 1, after "and", delete "tetrbromobisphenol" and insert therefor --tetrabromobisphenol--.

Column 16,
Line 13 (Table 1), delete "Divinylbenzene" and entire row.

Column 17,
Line 27, delete the formula in its entirety and insert therefor

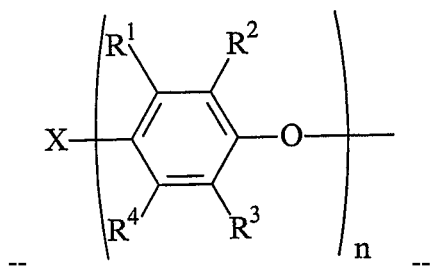

UNITED STATES PATENT AND TRADEMARK OFFICE
CERTIFICATE OF CORRECTION

PATENT NO.       : 6,617,398 B2
APPLICATION NO.  : 09/943342
DATED            : September 9, 2003
INVENTOR(S)      : Gary W. Yeager et al.

It is certified that error appears in the above-identified patent and that said Letters Patent is hereby corrected as shown below:

Column 20,
Line 13, delete the formula in its entirety and insert therefor

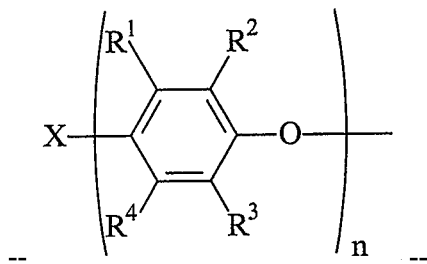

Column 21,
Line 7, after "wherein", delete "tbe" and insert therefor --the--.
Line 10, delete the formula in its entirety and insert therefor

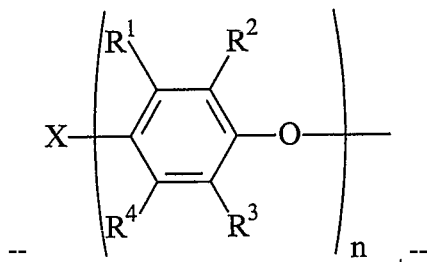

Line 55, after first occurrence of "of", delete "a of".
Line 67, before "di(methacrylate)", delete "dipropyl eneglycol" and insert therefor --dipropyleneglycol--.

UNITED STATES PATENT AND TRADEMARK OFFICE
CERTIFICATE OF CORRECTION

PATENT NO. : 6,617,398 B2
APPLICATION NO. : 09/943342
DATED : September 9, 2003
INVENTOR(S) : Gary W. Yeager et al.

It is certified that error appears in the above-identified patent and that said Letters Patent is hereby corrected as shown below:

Column 22,
Line 43, before "styrenic", delete "polyfuntional" and insert therefor --polyfunctional--.

Signed and Sealed this

Twenty-eighth Day of November, 2006

JON W. DUDAS
*Director of the United States Patent and Trademark Office*